US009153566B1

(12) United States Patent
Sato

(10) Patent No.: US 9,153,566 B1
(45) Date of Patent: Oct. 6, 2015

(54) SEMICONDUCTOR DEVICE MANUFACTURING METHOD AND SEMICONDUCTOR DEVICE

(71) Applicant: KABUSHIKI KAISHA TOSHIBA, Tokyo (JP)

(72) Inventor: Takao Sato, Yokkaichi Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/475,560

(22) Filed: Sep. 2, 2014

(30) Foreign Application Priority Data

Mar. 14, 2014 (JP) ................................. 2014-052716

(51) Int. Cl.
*H01L 25/00* (2006.01)
*H01L 25/07* (2006.01)
(52) U.S. Cl.
CPC .............. *H01L 25/50* (2013.01); *H01L 25/074* (2013.01); *H01L 2224/13* (2013.01); *H01L 2224/16145* (2013.01)
(58) Field of Classification Search
CPC ............................. H01L 25/50; H01L 25/074
USPC ........................................................ 438/114
See application file for complete search history.

(56) References Cited

U.S. PATENT DOCUMENTS

| 7,662,671 | B2 * | 2/2010 | Saeki ............................. 438/114 |
| 8,274,143 | B2 | 9/2012 | Fujishima et al. |
| 2010/0258933 | A1 * | 10/2010 | Fujishima et al. ............. 257/686 |
| 2010/0261311 | A1 * | 10/2010 | Tsuji ............................. 438/109 |
| 2013/0249014 | A1 | 9/2013 | Kito |
| 2014/0284817 | A1 | 9/2014 | Sato et al. |
| 2015/0069596 | A1 * | 3/2015 | Kawasaki et al. ............. 257/712 |

FOREIGN PATENT DOCUMENTS

JP 2007103632 4/2007
JP 2011142204 7/2011

* cited by examiner

*Primary Examiner* — Savitr Mulpuri
(74) *Attorney, Agent, or Firm* — Patterson & Sheridan, LLP

(57) ABSTRACT

A semiconductor device manufacturing method includes forming grooves in a surface of a semiconductor substrate, stacking a plurality of semiconductor chips in each area of the semiconductor substrate surrounded by the grooves to form stacked bodies, forming a first sealing resin layer that covers spaces between the plurality of semiconductor chips and lateral sides of the stacked bodies, separating the semiconductor substrate to singulate the stacked bodies, mounting the stacked bodies on a wiring substrate, forming a second sealing resin layer that seals the stacked bodies on the wiring substrate, separating the wiring substrate to singulate a portion of the wiring substrate with a single stacked body thereon, and grinding a portion of the semiconductor substrate in a thickness direction from a side of the semiconductor substrate opposite to the stacked bodies, after forming the first sealing resin layer and before singulating the wiring substrate.

14 Claims, 9 Drawing Sheets

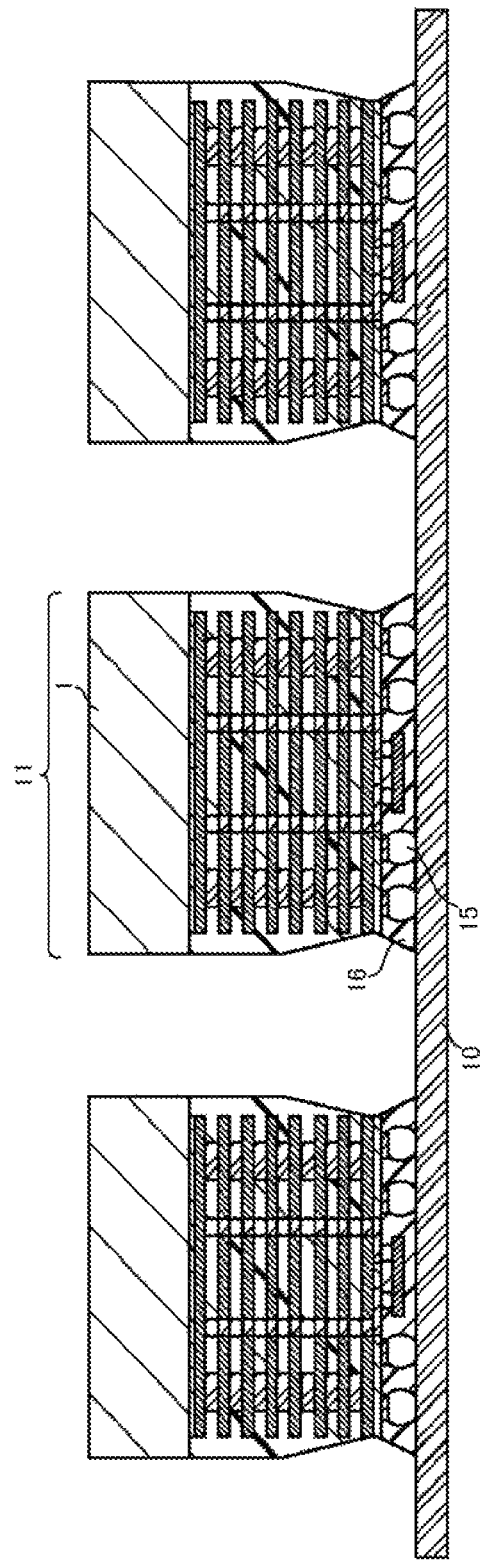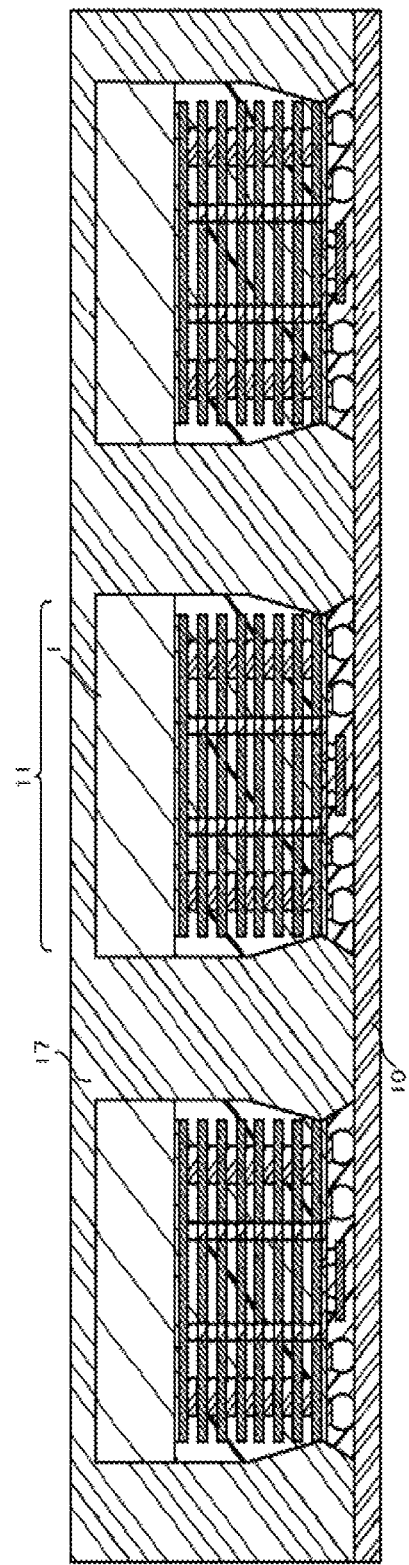

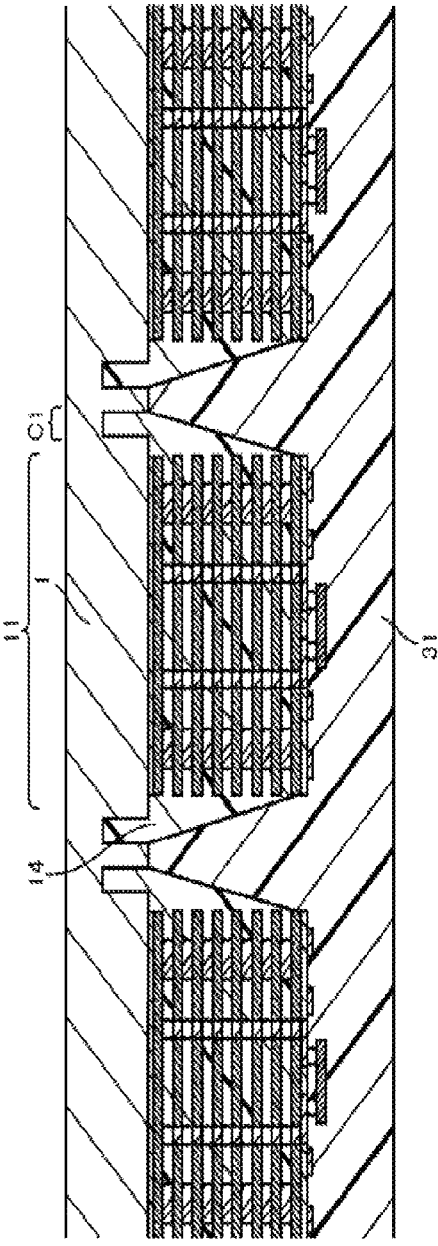
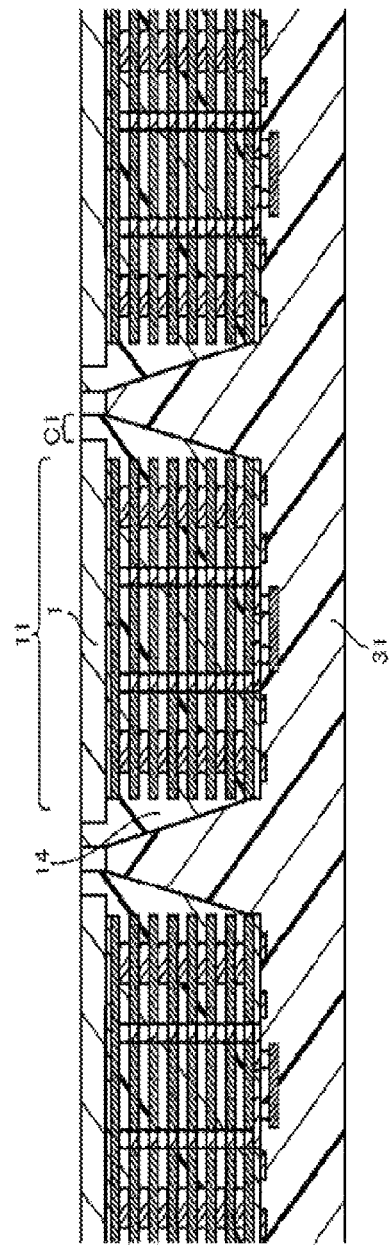

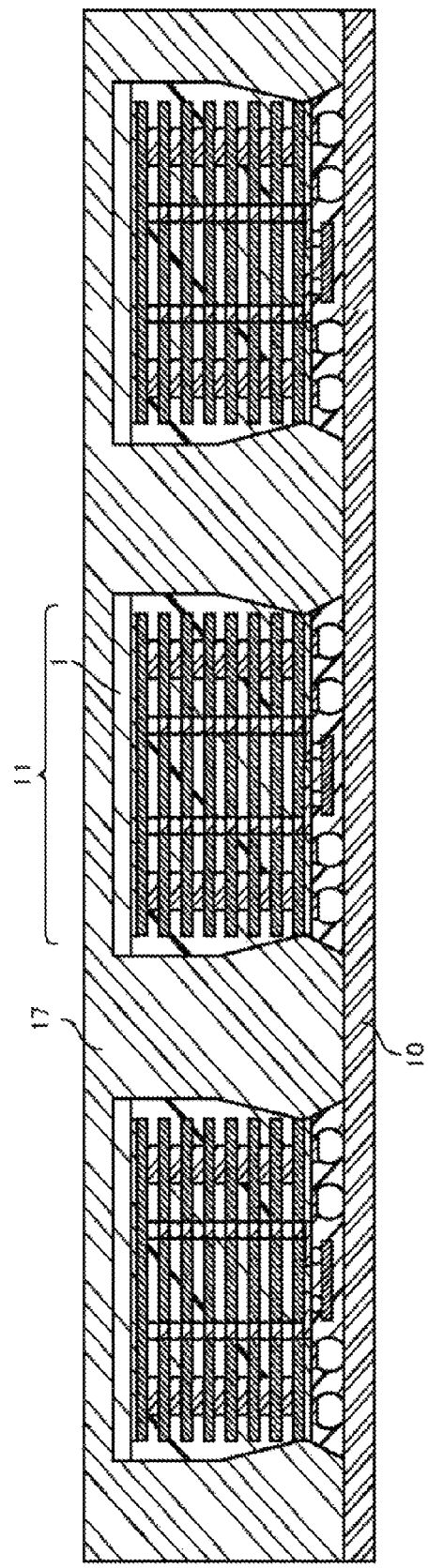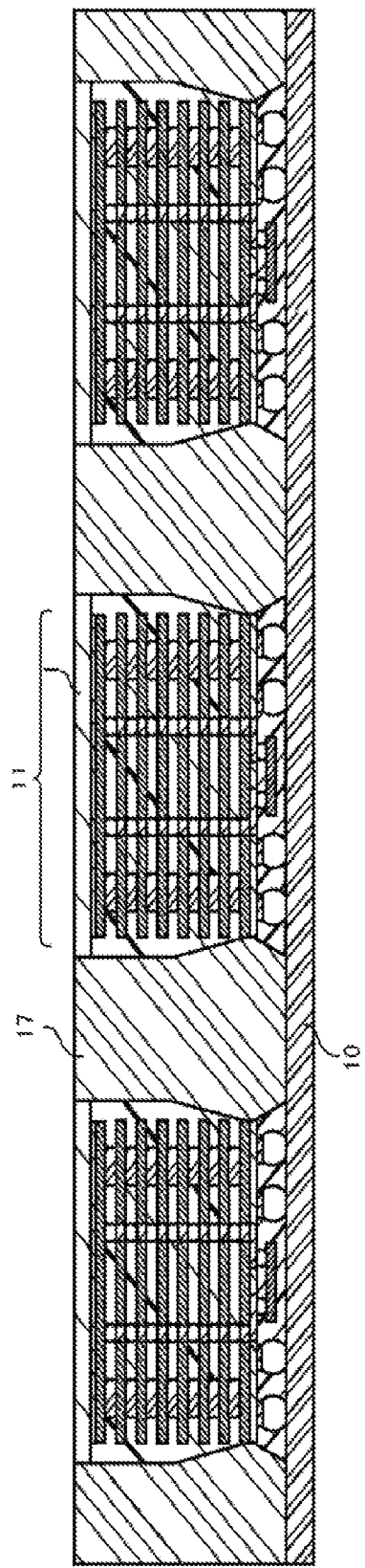

SEMICONDUCTOR DEVICE MANUFACTURING METHOD AND SEMICONDUCTOR DEVICE

CROSS-REFERENCE TO RELATED APPLICATION

This application is based upon and claims the benefit of priority from Japanese Patent Application No. 2014-052716, filed Mar. 14, 2014, the entire contents of which are incorporated herein by reference.

FIELD

Embodiments described herein relate generally to a semiconductor device manufacturing method and a semiconductor device.

BACKGROUND

As a result of advances in communication and information processing technology, the demand for further miniaturized, and faster, semiconductor devices continues. A packaged semiconductor device has been developed in response to this demand. In the packaged semiconductor device, the length of the wiring between components is shortened by using stacked semiconductor chips to increase the operation frequency (speed) of the device and improve the mounting area efficiency (number of semiconductor device elements per unit area is increased).

For example, in a semiconductor NAND flash memory, a three dimensional mounting structure is proposed to enable reduced package size and higher speed response, in which a memory controller and a memory chip are stacked on the same wiring substrate. The three dimensional mounting structure includes, for example, a stacked layer structure using Through Silicon Vias (TSV).

In the manufacture of a semiconductor device according to a stacked layer structure of the TSV method, a plurality of semiconductor chips are stacked on a metal plate such as a lead frame, the semiconductor chips are electrically connected to each other using through electrodes (TSVs) penetrating the semiconductor chips to form a stacked body, and an underfill resin is used to seal the semiconductor chips. Thereafter, a plurality of the stacked bodies are adhered to a wiring substrate, and the stacked bodies are located adjacent to, but electrically isolated from one another, on the wiring substrate. Thereafter, a sealing resin is located on the stacked bodies and adjacent areas of the wiring substrate to seal the stacked bodies from the local environment. After forming external connection terminals on the wiring substrate, the wiring substrate is separated by dicing, such as with a dicing saw, into individual substrates, each having a stacked body of semiconductor chips thereon.

In the sealing process for providing the underfill resin, a sealing material outflow preventing body is provided on the metal plate in order to limit the spreading of the underfill resin used to seal a stacked body to the area of an adjacent stacked body, and the spacing between adjacent stacked bodies required to accommodate the material outflow preventing bodies results in wasted space between adjacent stacked bodies. Further, in the three dimensional mounting structure of stacked bodies, a semiconductor device easily gets thick. In order to reduce the size of a resulting semiconductor device, for example, the surface area of the substrate used to form the stacked body has to be reduced and at the same time, the resulting semiconductor device has to be thinned.

DESCRIPTION OF THE DRAWINGS

FIGS. 4A and 4B are cross-sectional views for use in describing the example of the semiconductor device manufacturing method.

FIGS. 8A and 8B are cross-sectional views for use in describing the other example of the semiconductor device manufacturing method.

FIGS. 9A and 9B are cross-sectional views for use in describing the other example of the semiconductor device manufacturing method.

DETAILED DESCRIPTION

Figure 1:
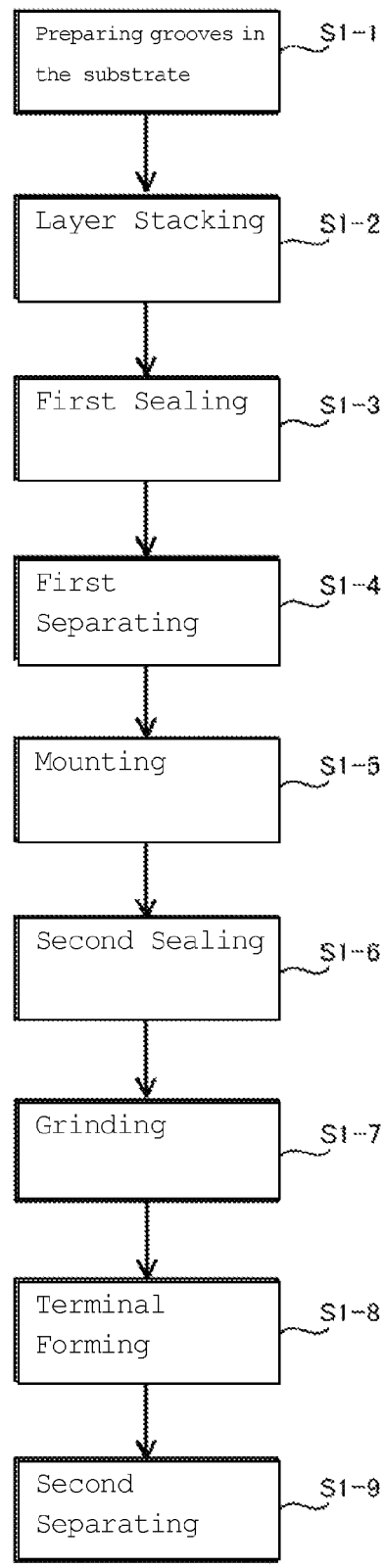
FIG. 1 is a flow chart illustrating an example of a semiconductor device manufacturing method.

In general, according to one embodiment, a semiconductor device is downsized.

According to one embodiment, a semiconductor device manufacturing method includes: forming grooves in a surface of a semiconductor substrate in a lattice (grid) pattern; forming a stacked body on the semiconductor substrate by stacking a plurality of semiconductor chips in each area surrounded by the grooves; forming a first sealing resin layer that covers spaces between the plurality of semiconductor chips and lateral sides of the plurality of semiconductor chips in each area surrounded by the grooves; separating the semiconductor substrate to singulate portions of the semiconductor substrate each having a single stacked body thereon; mounting the stacked bodies on a wiring substrate so that the semiconductor chips are positioned on a side of the wiring substrate; forming a second sealing resin layer that seals the stacked bodies on the wiring substrate; separating the wiring substrate to singulate portions of the wiring substrate each having a single stacked body thereon; and grinding a portion of the semiconductor substrate in a thickness direction from a side opposite to a side where the stacked bodies of the semiconductor substrate are formed, after forming the first sealing resin layer and before singulating the wiring substrate.

Hereinafter, embodiments will be described with reference to the drawings. Here, the drawings are schematic and in some cases, for example, a relation between thickness and measurement on a plane and a ratio of thickness of each layer are different from the actual ratios and thicknesses. Further, in the embodiments, the same reference numerals are attached to substantially the same components throughout the drawing figures, and repeated description thereof is omitted.

First Embodiment

FIG. 1 is a flow chart illustrating an example of a semiconductor device manufacturing method. The example of the semiconductor device manufacturing method illustrated in FIG. 1 includes at least a preparing process (S1-1) for preparing a semiconductor substrate, a layer stacking process (S1-2) for forming a stacked body by stacking a plurality of semiconductor chips on the semiconductor substrate, a first sealing process (S1-3) for forming a sealing resin layer for filling the spaces between the semiconductor chips and the lateral sides of the semiconductor chips on the semiconductor substrate, a first separating process (S1-4) for separating the semiconductor substrate into individual sections, each having a single stacked body thereon, a mounting process (S1-5) for mounting the stacked bodies onto the wiring substrate, a second sealing process (S1-6) for forming a sealing resin layer to seal the stacked bodies, a grinding process (S1-7) for grinding away the rear portion of the semiconductor substrate, a terminal forming process (S1-8) for forming external connection terminals on the ground surface of the semiconductor substrate, and a second separating process (S1-9) for separating the wiring substrate in accordance with the stacked bodies. The above processes will be further described with reference to the drawings.

Figure 2A:
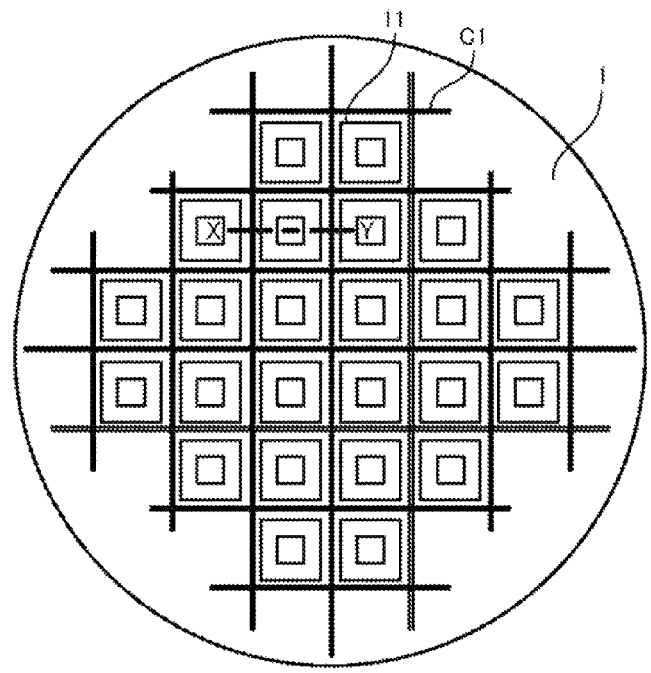
FIGS. 2A and 2B are views for use in describing the example of the semiconductor device manufacturing method.
Figure 2B:
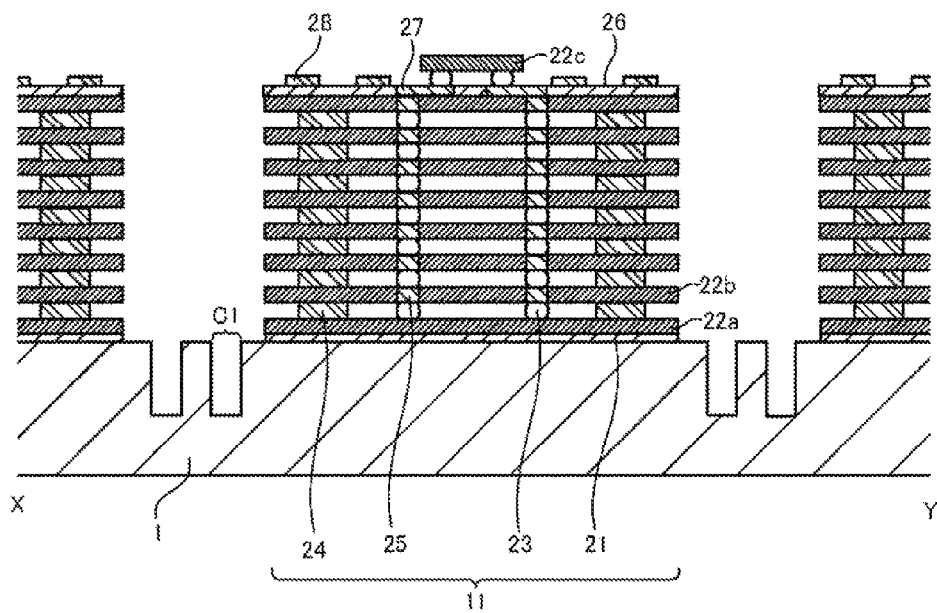

The preparing process (S1-1) and the layer stacking process (S1-2) will be described with reference to FIGS. 2A and 2B. FIG. 2A is a top plan view and FIG. 2B is a cross-sectional view taken along the line X-Y in FIG. 2A of a semiconductor substrate 1 having a plurality of stacked bodies 11 of semiconductor chips 22a, 22b located thereon. For the sake of convenience, FIG. 2A shows only a portion of the components of FIG. 2B with others omitted. Here, a description will be made in an example of forming a plurality of stacked bodies 11 on one semiconductor substrate 1.

In the preparing process (S1-1), a semiconductor substrate 1 is prepared. The semiconductor substrate 1 is provided with grooves C1 formed in a rectilinear lattice or grid shaped pattern on the surface. The grooves C1 function to prevent the underfill resin from spreading unnecessarily, and also function as an alignment mark used for alignment when forming the stacked bodies 11 on the substrate. Thus, the grooves C1 define rectangular perimeters of a rectangular pad structure on which each stacked body 11 is formed. As shown in FIG. 2A, the groove C1 pattern includes parallel grooves, in such a way that a rectangular pad is defined to receive a stacked body 11, and at the sides of each pad area or location, two grooves C1 located generally parallel to one another extend into the surface of the semiconductor substrate 1. Therefore, around each "pad" formed to receive a stacked body, a dedicated rectangular depression or moat is formed, and between any two pad locations, two spaced apart grooves C1 extend. The depth of the groove C1 is, for example, 50 μm to 100 μm. The groove C1 is preferably provided (begins) at a location inward from the edge of the semiconductor substrate 1, as illustrated in FIG. 2A. The groove C1 is formed by grinding or cutting into the semiconductor substrate 1, for example, by using a rotating diamond blade or wheel. The cross sectional shape of the groove C1 is not particularly restricted. In the preparing process (S1-1), the grooves C1 are formed in the surface of the semiconductor substrate 1.

As the semiconductor substrate 1, for example, a silicon substrate may be used. A silicon substrate is preferred because the process of forming the grooves C1 and thinning of the substrate is relatively easy. The semiconductor substrate 1 may be a recycled substrate. In FIG. 2A, although the shape of the semiconductor substrate 1 is circular, it is not restricted to this and it may be, for example, rectangular.

In the layer stacking process (S1-2), the result of which is illustrated in FIGS. 2A and 2B, a plurality of semiconductor chips are stacked in an area surrounded by the grooves C1 on the semiconductor substrate 1, hence to form a stacked body 11.

In forming the stacked body 11, at first, a semiconductor chip 22a is adhered to the semiconductor substrate 1 with an adhesive layer 21 interposed therebetween. As the adhesive layer 21, for example, a resin film such as polyimide may be used. The adhesive layer 21 is hardened by curing after the semiconductor chip 22a is adhered there.

Then, a plurality of semiconductor chips 22b are stacked thereover. Here, the semiconductor chips 22b are stacked, for example, in seven stages, to locate seven semiconductor chips 22b on the first semiconductor chip 22a. The semiconductor chips 22b each have through electrodes 25 (TSV structures). The plurality of semiconductor chips 22b are adhered together with each adhesive layer 24 interposed therebetween, and they are electrically connected to each other by bump electrodes 23 formed on the surfaces of the respective semiconductor chips 22b which electrically connect with the through electrodes 25 penetrating the respective semiconductor chips 22b. Here, an electrode pad may be provided on the surface of the semiconductor chip 22b opposite to the surface having the bump electrode 23 and this semiconductor chip 22b may be electrically connected to another semiconductor chip 22b through the electrode pad and the bump electrode 23. The semiconductor chip 22b in the bottom layer is adhered to the semiconductor chip 22a with the adhesive layer 24 interposing therebetween and it may be electrically connected to the semiconductor chip 22a through the bump electrode 23 and the through electrode 25.

As the semiconductor chip 22a and the semiconductor chip 22b, for example, a memory chip may be used. As the memory chip, for example, a storage element chip such as a NAND flash memory chip may be used. A decoder and the like may be provided in the memory chip. A through electrode may be provided in the semiconductor chip 22a and the through electrode may connect the semiconductor chip 22a to the semiconductor chip 22b electrically.

As the bump electrode 23, for example, gold bump, copper bump, or solder bump may be used, and as the solder bump, a lead-free solder such as tin-silver based alloy and tin-silver-copper based alloy may be used.

The adhesive layer 24 has a function as a spacer for maintaining a desired interval (spacing or gap) between the semiconductor chips 22b. As the adhesive layer 24, for example, a thermosetting resin may be used.

Further, a wiring layer 26 is formed on the semiconductor chip 22b of the upmost layer. Further, electrode pads 28 are formed on the wiring layer 26.

An example of the wiring layer 26 is a re-wiring layer for re-distributing the contact locations to the electrodes in the semiconductor chip 22b. The rewiring layer includes a connection wiring 27 having a plurality of conductive wires or traces, having an inner pad end for contact with the electrode locations on the semiconductor chip 22b, and a second pad located outwardly thereof, in the plane of the semiconductor chip 22b, such that the spacing between the second pads is greater than that of the first pad and of the semiconductor chip 22b. The wiring layer 26 is a re-wiring layer formed on the semiconductor chip 22b, including a connection wiring 27. The connection wiring 27 is electrically connected to the through electrodes 25 of the semiconductor chip 22b of the upmost layer.

As the material of the connection wiring 27 and the electrode pad 28, a single layer or a stacked layer of, for example, copper, titanium, titanium nitride, chromium, nickel, gold, or palladium may be used.

Next, a semiconductor chip 22c is disposed on the wiring layer 26. As the semiconductor chip 22c, for example, a flip-chip type semiconductor chip may be used and it is electrically connected to the connection wiring 27 through a connection terminal such as a solder balls. For example, according to the thermal compression bonding or solder reflow under a reducing atmosphere, the semiconductor chip 22c may be electrically connected to the connection wiring 27. As the semiconductor chip 22c, for example, an interface chip or a controller chip may be used. For example, when the semiconductor chip 22b is a memory chip, a controller chip is used for the semiconductor chip 22c and the controller chip may be used to control the writing to, and reading of, the memory chip. Here, the semiconductor chip 22c is preferably smaller than the semiconductor chip 22b. In other words, the semiconductor chip 22c is preferably provided to extend over only a portion of the semiconductor chip 22b.

According to the above processes, a plurality of stacked bodies 11 are formed directly on the semiconductor substrate 1. Thus, each stacked body 11 includes the underlying portion of the semiconductor substrate 1, the semiconductor chip 22a provided on the semiconductor substrate 1, a plurality of semiconductor chips 22b stacked on the semiconductor chip 22a, the wiring layer 26 having the connection wiring 27 provided on the semiconductor chip 22b, and the semiconductor chip 22c provided on the wiring layer 26. The semiconductor chip 22a is electrically connected to the semiconductor chip 22b through the bump electrodes 23, the semiconductor chip 22b includes a through electrode 25 extending through the chip, and the chips 22b are electrically connected to each other through the bump electrodes 23 and the through electrodes 25, and the semiconductor chip 22c is electrically connected to the semiconductor chip 22b through the connection wiring 27. Thus, by using the stacked body 11 of the stacked layer structure interconnected by TSVs, the area of a chip may be reduced and the number of connection terminals may be increased.

Next, the first sealing process (S1-3), the first separating process (S1-4), the mounting process (S1-5), the second sealing process (S1-6), the grinding process (S1-7), the terminal forming process (S1-8), and the second separating process (S1-9) will be described with reference to FIGS. 3A to 5B. FIGS. 3A to 5B are cross-sectional views for use in describing an example of the semiconductor device manufacturing method.

Figure 3A:
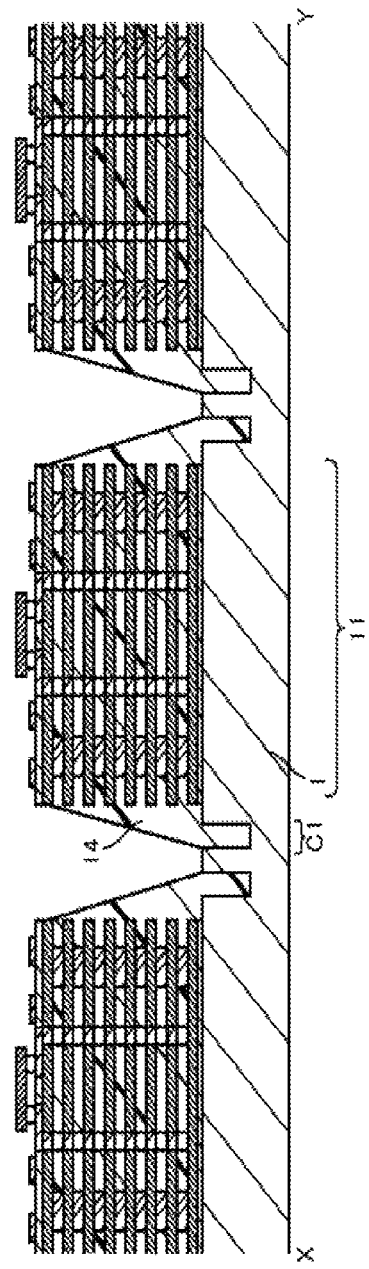
FIGS. 3A and 3B are cross-sectional views for use in describing the example of the semiconductor device manufacturing method.

In the first sealing process (S1-3), as illustrated in FIG. 3A, a sealing resin layer 14 for filling the spaces between the plurality of semiconductor chips and the lateral sides of the plurality of semiconductor chips in the stacked body 11 is formed on the semiconductor substrate 1. For example, by discharging an underfill resin through a dispenser using a needle, the sealing resin layer 14 may be formed. A triangular shaped fillet is formed on the lateral side of the sealing resin layer 14.

According to the example of the semiconductor device manufacturing method of the embodiment, the lattice pattern of grooves C1 is formed on the surface of the semiconductor substrate 1 and the stacked body 11 is formed in each area surrounded by the grooves C1 on the semiconductor substrate 1, so that the underfill resin is restrained from spreading across the grooves C1 as excess resin will flow into the grooves C1 and thus not across an un-grooved portion of the semiconductor substrate 1 into the region of an adjacent stacked body 11. Thus, for example, the underfill resin is restrained from outflowing to the adjacent area of forming another stacked body 11. Accordingly, for example, when one semiconductor substrate 1 is used to form a plurality of stacked bodies 11, the spacing between the areas of forming the stacked bodies 11 may be reduced, hence increasing the number of stacked bodies 11 that can be mounted on a single semiconductor substrate 1.

Figure 3B:
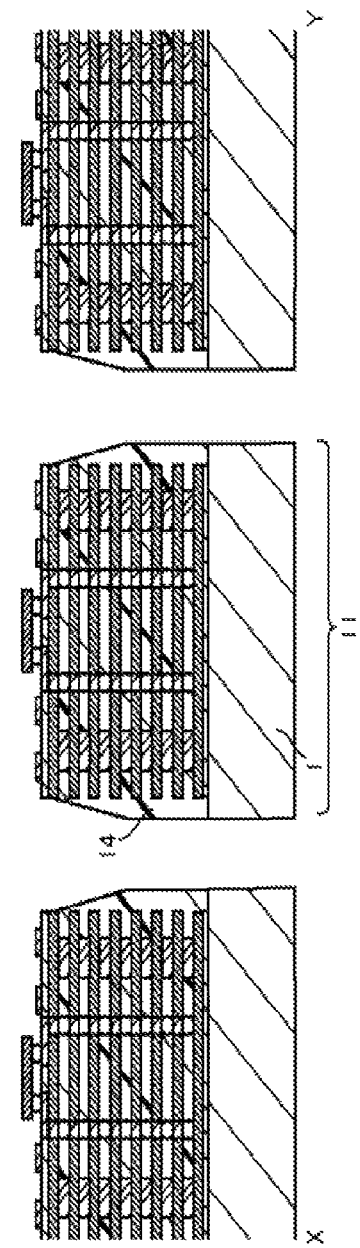

In the first separating process (S1-4), as illustrated in FIG. 3B, the semiconductor substrate 1 is separated in to singulate be plurality of stacked bodies 11. For example, by cutting the semiconductor substrate 1 by a blade such as a diamond blade or diamond wheel, the semiconductor substrate 1 may be cut to yield individual, singulated, stacked bodies. In the first separating process (S1-4), it is preferable that the semiconductor substrate 1, and at least a portion of the fillet of resin extending from the side of the stacked ships, are cut simultaneously. Further, during cutting to singulate semiconductor substrate having the individual stacked bodies thereon, the location of the cut is inwardly of (in the direction of the stacked chips from) or at least co-planar with, the surface of the groove C1 closest to the stacked ships, and thus the groove C1 is eliminated. Accordingly, the width of the semiconductor device may be smaller than in the case of forming the stacked body on the metal plate having, for example, a sealing material outflow preventing body.

In the mounting process (S1-5), as illustrated in FIG. 4A, a plurality of individual stacked bodies 11 are mounted on the wiring substrate 10 having a first, stacked body receiving, surface and a second surface on the opposite side of wiring substrate 10. Here, the stacked bodies 11 are mounted on the first surface of the wiring substrate 10 so that the semiconductor chips may be positioned facing the first surface of the wiring substrate 10. For example, a mounting tool may be used to mount the stacked bodies 11 on the substrate 10. The stacked bodies 11 are electrically connected to the wiring substrate 10 by soldering materials 15, for example solder balls, provided on the electrode pads 28 of the wiring layer 26 (FIGS. 1A and 1B) or located on the first surface of the wiring substrate 10 in a pattern of the electrode pads 28 of the wiring layer 26. For example, a pulse heating method may be used to join together the wiring substrate 10 and the stacked bodies 11. After the stacked bodies 11 are temporarily adhered to the wiring substrate 10, the stacked bodies 11 may be firmly adhered together using the soldering materials 15, and performing a reflow soldering step. Further, a sealing resin layer 16 for sealing the space between the wiring substrate 10 and the stacked body 11 is formed. For example, by discharging the underfill resin, the sealing resin layer 16 may be formed between the stacked boy 11 and the first surface of the wiring substrate 10. Here, the sealing resin layer 16 does not necessarily have to be provided.

As the wiring substrate 10, for example, a resin substrate of glass epoxy and the like with a wiring layer formed on the surface thereof may be used. The wiring layer includes connection pads and, for example, through the connection pads, the wiring substrate 10 is electrically connected to the electrode pad of the stacked body 11. The first surface of the wiring substrate 10 corresponds to the top surface of the wiring substrate 10 in FIG. 4A and the second surface corresponds to the bottom surface of the wiring substrate 10 in FIG. 4A. The first surface and the second surface of the wiring substrate 10 mutually face away from each other.

In the second sealing process (S1-6), as illustrated in FIG. 4B, a sealing resin layer 17 for sealing the stacked bodies 11 is formed. For example, by charging the sealing resin, the sealing resin layer 17 may be formed. FIG. 4B shows the sealing resin layer 17 covering the semiconductor substrate 1; however, it is not restricted to this but the sealing resin layer 17 may be formed such that a portion of the semiconductor substrate 1 is exposed. As the sealing resin, a material containing an inorganic filler such as $SiO_2$, for example, and a mixture of the inorganic filler and insulating organic resin material may be used. For example, a mixture of inorganic filler and an epoxy resin may be used. The inorganic filler occupies 80% to 95% of the whole, having the function of adjusting the viscosity and the hardness of the sealing resin layer. The sealing resin layer 17 using the above sealing resin is preferable because its adhesion to the semiconductor substrate 1 is high.

Figure 5A:
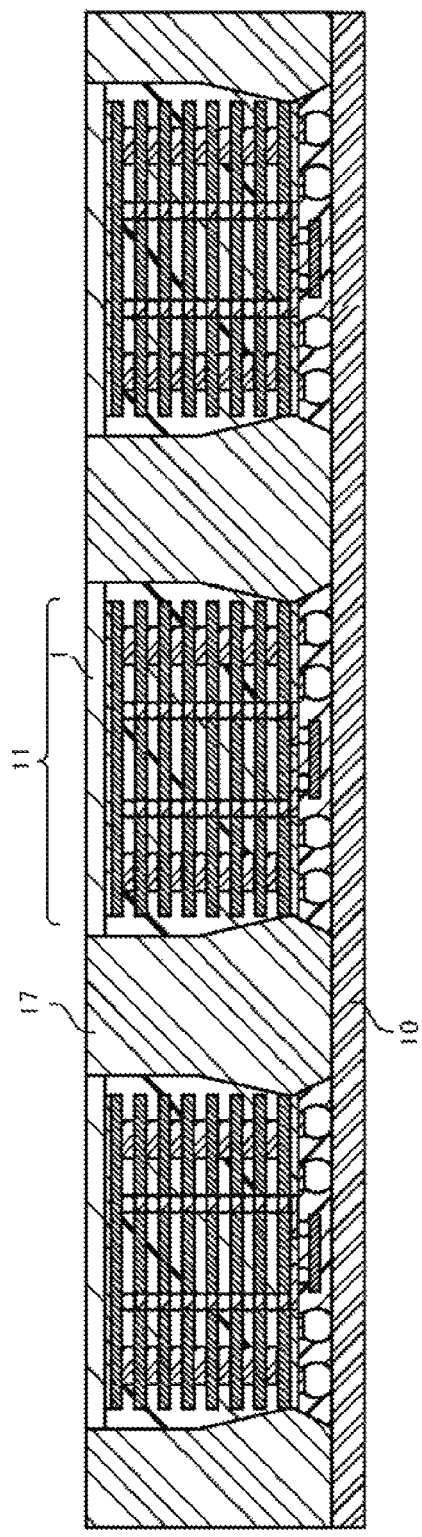
FIGS. 5A and 5B are cross-sectional views for use in describing the example of the semiconductor device manufacturing method.

In the grinding process (S1-7), as illustrated in FIG. 5A, at least a portion of the back side (the side on which the semiconductor chips are not stacked) of the semiconductor substrate 1 is ground away in a thickness direction. For example, the second surface of the wiring substrate 10 is adhered to and held by a fixing tape, and using an abrasive blasting and/or a Chemical Mechanical Polishing (CMP) process, a portion of the semiconductor substrate 1 may be ground away. Here, although the example of grinding a portion of the sealing resin layer 17 and a portion of the semiconductor substrate 1 from the surface opposite to the surface where the stacked bodies 11 of the semiconductor substrate 1 are formed is shown, it is not restricted to this but, for example, by forming a stacked body 11 without the semiconductor substrate, but on which the uppermost (in FIGS. 5A and 5B) semiconductor chip 22a is thicker than the remainder of the semiconductor chips 22b, the semiconductor chip 22a may be ground to a thinner thickness.

By grinding away a portion of the semiconductor substrate 1 in the grinding process (S1-7), the semiconductor substrate may be reduced in thickness. The thickness of the semiconductor substrate 1 after the grinding process (S1-7) is preferably, for example, 50 µm to 100 µm. The timing of performing the grinding process (S1-7) is not restricted to after the sealing resin 17 is formed as in FIG. 5A, but it may be performed at least after the first sealing process (S1-3) and before the second separating process (S1-9).

Figure 5B:
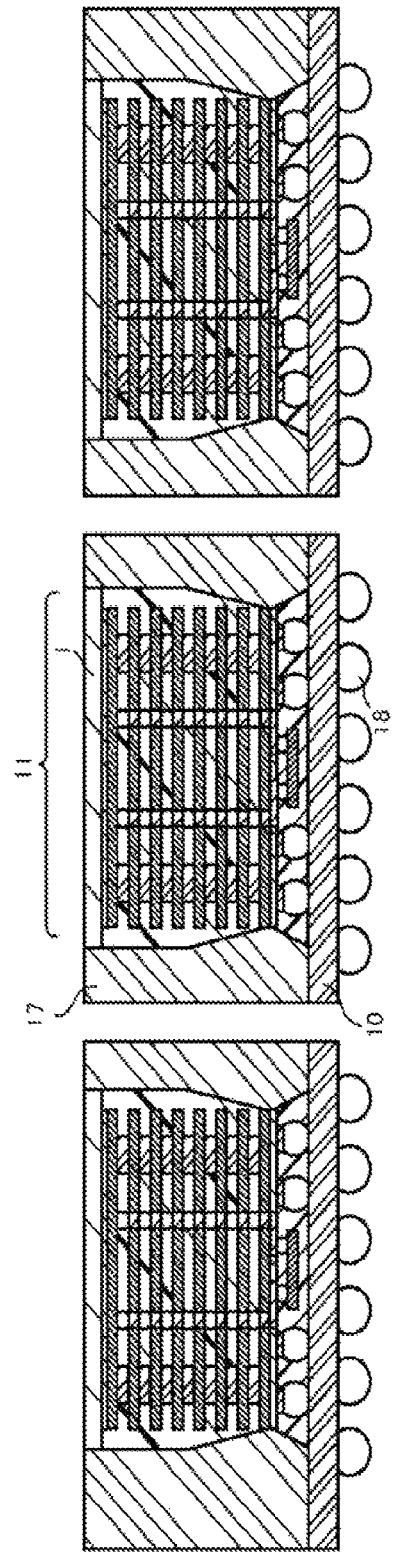

In the terminal forming process (S1-8), the result of which is illustrated in FIG. 5B, external connection terminals 18 are formed on the second surface of the wiring substrate 10. For example, after flux is applied on the second surface of the wiring substrate 10, soldering balls are located there and the singulated wiring substrates 10 and stacked chips 11 having the resin layer 17 thereon are placed in a reflow oven, to melt the soldering balls and thereby join them to the connection pads of the wiring substrate 10. Then, the flux is removed from the second surface of the substrate using a solvent or pure water washing, and thus external connection terminals 18 are formed.

In the second separating process (S1-9), as illustrated in FIG. 5B, the wiring substrate 10 is separated in accordance with the stacked bodies 11. For example, after the second surface of the wiring substrate 10 is adhered to a dicing tape and the wiring substrate 10 is held by a dicing ring, the wiring substrate 10 may be separated by dicing (cutting through) thereof using a diamond blade or disk. Thus, a completed semiconductor device is manufactured.

The contents of the processes and their procedure in the example of the semiconductor device manufacturing method according to the embodiment are not necessarily restricted to the above. Further, in addition to the above processes, for example, a marking process for marking the product information, a heat treatment process, and a shield layer forming process for forming a shield layer for covering the sealing body may be provided.

Figure 6A:
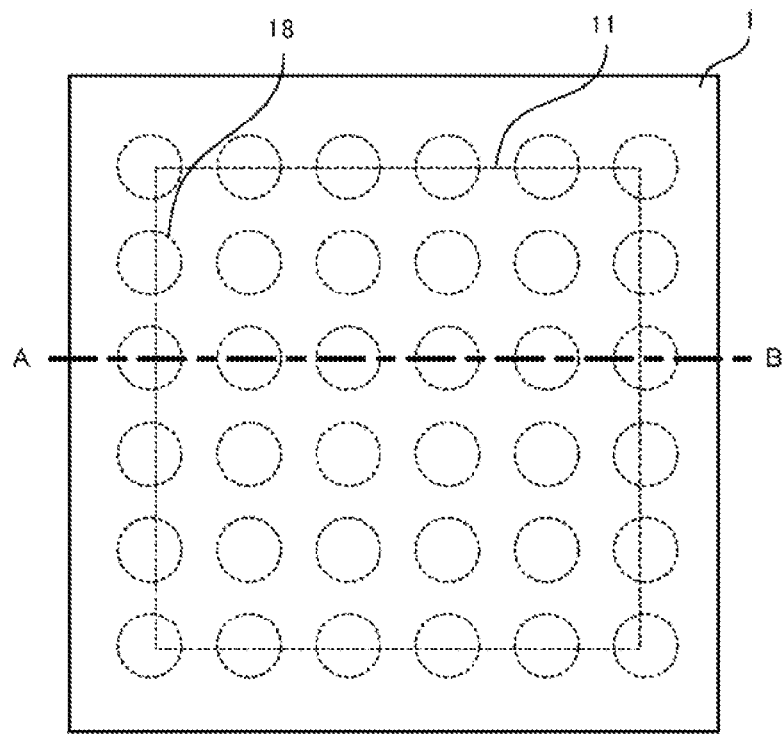
FIGS. 6A and 6B are views illustrating a structure example of a semiconductor device.
Figure 6B:
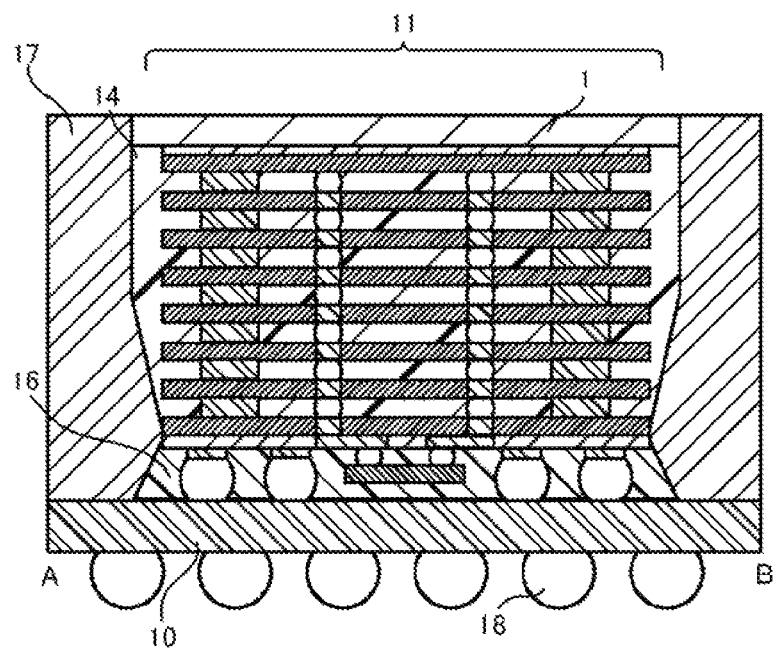

An example of the structure of a semiconductor device manufactured passing through the above manufacturing process is shown in FIGS. 6A and 6B. FIG. 6A is a top plane view and FIG. 6B is a cross-sectional view taken along the line A-B in FIG. 6A. In FIG. 6A, some of the components are not illustrated for the sake of convenience.

The semiconductor device illustrated in FIGS. 6A and 6B includes the wiring substrate 10 having the first surface and the second surface facing each other, the stacked body 11 including the semiconductor substrate 1 and the plurality of semiconductor chips stacked on the semiconductor substrate 1, which is mounted on the first surface of the wiring substrate 10 so that the semiconductor chips may be positioned on the first surface of the wiring substrate 10, the sealing resin layer 14 for sealing the space between the plurality of semiconductor chips, the sealing resin layer 16 for sealing the space between the wiring substrate 10 and the stacked body 11, the sealing resin layer 17 provided to seal the stacked body 11 with at least a portion of the semiconductor substrate 1 exposed on the first surface of the wiring substrate 10, and external connection terminals 18 provided on the second surface of the wiring substrate 10.

By exposing the back side of the semiconductor substrate through the sealing resin 17, heat dissipation of the semiconductor device may be improved; for example, the semiconductor device may be cooled by heat transfer through the semiconductor substrate 1. Further, the semiconductor substrate 1 is thin, for example, in the range of 50 µm to 100 µm, and the sealing resin layer 14 has a lateral surface continuous, but extending outwardly only a short distance from the end of, the lateral surface of the semiconductor substrate 1. Accordingly, the semiconductor device manufacturing method of the embodiment may reduce the semiconductor substrate in thickness and at the same time, shorten the width of the semiconductor device, thereby reducing the size of the semiconductor device.

Second Embodiment

In this embodiment, another example of a semiconductor device manufacturing method which is partly different from the processes in the first embodiment will be described.

Figure 7:
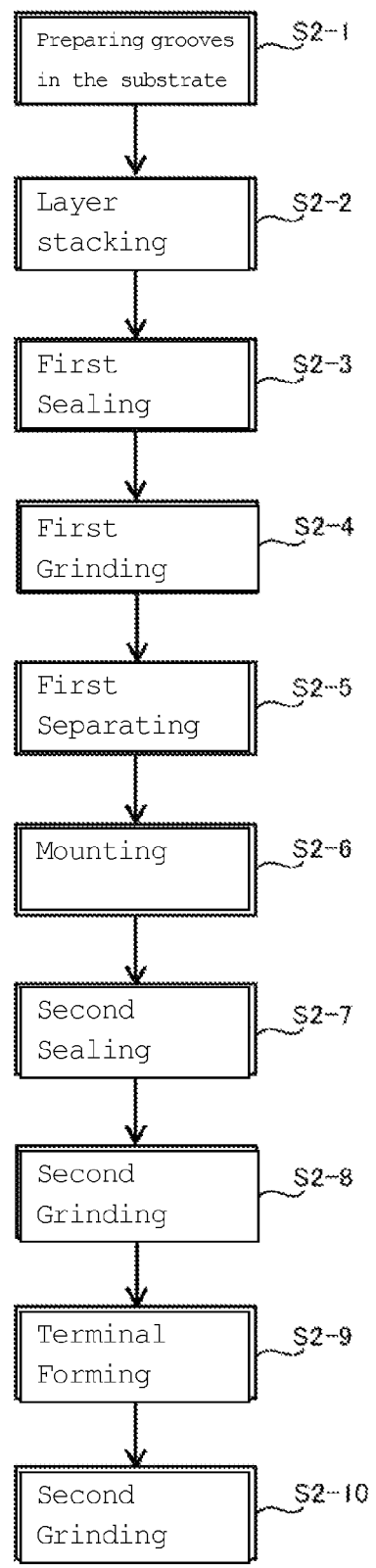
FIG. 7 is a flow chart illustrating another example of the semiconductor device manufacturing method.

FIG. 7 is a flow chart illustrating the other example of a semiconductor device manufacturing method. The example of the semiconductor device manufacturing method shown in FIG. 7 includes at least a preparing process (S2-1) for preparing a semiconductor substrate, a layer stacking process (S2-2) for forming a stacked body by stacking a plurality of semiconductor chips on a semiconductor substrate, a first sealing process (S2-3) for forming a sealing resin layer of covering the spaces between the semiconductor chips and the lateral sides of the semiconductor chips on the semiconductor substrate, a first grinding process (S2-4) for grinding a portion of the semiconductor substrate, a first separating process (S2-5) for separating the semiconductor substrate in accordance with the stacked bodies, a mounting process (S2-6) for mounting the stacked bodies on the wiring substrate, a second sealing process (S2-7) for forming a sealing resin layer of sealing the stacked bodies, a second grinding process (S2-8) for exposing a portion of the semiconductor substrate by grinding the sealing resin layer of sealing the stacked bodies, a terminal forming process (S2-9) for forming external connection terminals, and a second separating process (S2-10) for separating the wiring substrate in accordance with the stacked bodies. The contents and the procedure of the processes in the example of the semiconductor device manufacturing method according to the embodiment are not necessarily restricted to the above processes.

The preparing process (S2-1) corresponds to the preparing process (S1-1) in the first embodiment. The layer stacking process (S2-2) corresponds to the layer stacking process (S1-2). The first sealing process (S2-3) corresponds to the first sealing process (S1-3). The first separating process (S2-5) corresponds to the first separating process (S1-4). The mounting process (S2-6) corresponds to the mounting process (S1-5). The second sealing process (S2-7) corresponds to the second sealing process (S1-6). The terminal forming process (S2-9) corresponds to the terminal forming process (S1-8). The second separating process (S2-10) corresponds to the second separating process (S1-9). Here, the processes corresponding to the manufacturing processes of the first embodiment are to be properly referred to the above description of the respectively corresponding processes. The differences in the processes from the first embodiment will be further described with reference to the drawings.

In the example of the semiconductor device manufacturing method according to the embodiment, the preparing process (S2-1) to the first sealing process (S2-3) are performed similarly to the example of the semiconductor device manufacturing method in the first embodiment.

Next, the first grinding process (S2-4) will be described with reference to FIGS. 8A and 8B. FIGS. 8A and 8B are cross-sectional views for use in describing the example of the semiconductor device manufacturing method according to this embodiment.

An example of a semiconductor device formed through the preparing process (S2-1) to the sealing process (S2-3) includes a semiconductor substrate 1, a stacked body 11 provided on the semiconductor substrate 1, and a sealing resin layer 14 for covering the spaces between the plurality of semiconductor chips and the lateral sides of the plurality of semiconductor chips in the stacked body 11, as illustrated in FIG. 8A. Here, the same components as those of the semiconductor device in the first embodiment are to be properly referred to the corresponding description about the above semiconductor device.

In the first grinding process (S2-4), as illustrated in FIG. 8A, the semiconductor substrate 1 is fixed to a fixing tape 31. Here, the semiconductor substrate 1 is fixed so that the stacked body 11 may be positioned on the fixing tape 31. As the fixing tape 31, for example, a photocurable fixing tape material may be used. Photocurable fixing tape is preferable because it has a good adhesion and conforms into the recesses between the stacked bodies 11 on the semiconductor substrate 1.

Then, as illustrated by the difference in the thickness of the semiconductor substrate 1 in FIG. 8B versus FIG. 8A, a portion of the semiconductor substrate 1 is ground from the side thereof opposite to the side where the stacked bodies 11 are located on the semiconductor substrate 1. For example, through a blasting and/or a CMP (chemical mechanical polishing) process step, a portion of the semiconductor substrate 1 may be ground away.

By grinding away a portion of the semiconductor substrate 1 in the first grinding process (S2-4), the semiconductor substrate 1 is reduced in thickness. The thickness of the semiconductor substrate 1 after the first grinding process (S2-4) is preferably, for example, 50 μm to 100 μm.

Then, the fixing tape 31 is peeled off of the stacked bodies 11, and similarly to the first embodiment, the first separating process (S2-5) and the mounting process (S2-6) are then performed.

Next, the second sealing process (S2-7) and the second grinding process (S2-8) will be described with reference to FIGS. 9A and 9B. FIGS. 9A and 9B are cross-sectional views for use in describing the example of the semiconductor device manufacturing method according to this embodiment.

In the second sealing process (S2-7), the sealing resin layer 17 for sealing the stacked bodies 11 is formed as illustrated in FIG. 9A. For example, the sealing resin layer 17 may be formed by charging the sealing resin. FIG. 9A shows the sealing resin layer 17 covering the first surface side of the semiconductor substrate 1 between the stacked bodies 11; however, the sealing resin layer 17 may be formed such that a portion of the semiconductor substrate 1 between the stacked bodies 11 is exposed, i.e., not covered by the sealing resin layer 17.

In the second grinding process (S2-8), as illustrated in FIG. 9B, the exposed surface of the sealing resin layer 17 extending over the semiconductor substrate 1 is ground away to expose the back side surface (non-stacked body receiving surface) of the semiconductor substrate 1. In the second grinding process (S2-8), a portion of the semiconductor substrate 1 may also be ground away. As a grinding means, the same means as in the grinding process (S1-7) in the first embodiment may be used; therefore, reference is made to the description of the grinding process (S1-7) in the first embodiment.

By exposing the back surface side of the semiconductor substrate 1, heat dissipation of the semiconductor device may be improved; for example, the semiconductor device may be cooled by heat transfer through the semiconductor substrate 1. The second grinding process (S2-8) may be omitted in the example of the semiconductor device manufacturing method according to the embodiment.

Then, the terminal forming process (S2-9) and the second separating process (S2-10) are performed similarly to the first embodiment. According to the above, a semiconductor device may be manufactured. The structure of the semiconductor device according to the second embodiment may be properly referred to the description of the semiconductor device illustrated in FIGS. 6A and 6B.

According to the semiconductor device manufacturing method of the embodiment, a portion of the semiconductor substrate 1 is ground in the first grinding process (S2-4) before separating the semiconductor substrate 1; therefore, the semiconductor substrate 1 may be reduced in thickness and at the same time, the amount of the sealing resin used may be reduced in the second sealing process (S2-7). As a result, the semiconductor device may be further reduced in thickness, more than in the first embodiment. Thus, the semiconductor device manufacturing method of the embodiment may reduce the thickness of a semiconductor substrate as well as the width of a semiconductor device, thereby reducing the size of the semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:

forming a plurality of grooves in a surface of a semiconductor substrate and forming a plurality of isolated pad areas, each pad area surrounded by one of the grooves;

forming a stacked body by stacking a plurality of semiconductor chips on each pad area of the semiconductor substrate;

forming a first sealing resin layer to fill spaces between the plurality of semiconductor chips that have been stacked and on the lateral sides of the plurality of semiconductor chips that have been stacked;

separating the semiconductor substrate into a plurality of singulated stacked bodies each having a pad area and a plurality of semiconductor chips stacked thereon;

mounting the stacked bodies on a wiring substrate;

forming a second sealing resin layer that seals the stacked bodies on the wiring substrate;

separating the wiring substrate into sections, each section having a single stacked body thereon; and grinding a portion of the semiconductor substrate in a thickness direction from a side opposite to a side where the stacked bodies of the semiconductor substrate are formed, after forming the first sealing resin layer and before separating the wiring substrate.

2. The method according to claim 1, further comprising:
grinding a portion of the semiconductor substrate after forming the second sealing resin layer.

3. The method according to claim 2, further comprising:
before grinding a portion of the semiconductor substrate, removing at least a portion of the second sealing resin layer.

4. The method according to claim 1, further comprising:
grinding a portion of the semiconductor substrate before separating the semiconductor substrate.

5. The method according to claim 1, wherein said separating the semiconductor substrate includes:
cutting the semiconductor substrate into a plurality of singulated stacked bodies each having a pad area and a plurality of semiconductor chips while also cutting the first sealing resin layer.

6. The method according to claim 5, further comprising:
cutting the semiconductor substrate at a location of, or to the stacked body side of, the grooves.

7. The method according to claim 1, further comprising:
while forming the first sealing resin layer, flowing any excess first resin material into at least a portion of the groove surrounding the pad area.

8. The method according to claim 1, wherein two grooves extend between adjacent pad areas.

9. The method of claim 1, further comprising cutting the grooves in straight lines in a lattice pattern to form a plurality of rectangular pad areas.

10. A method of manufacturing a semiconductor device, comprising:
providing a semiconductor substrate;

forming a plurality of grooves in a surface of the semiconductor substrate in a rectilinear grid pattern, a plurality of rectangular pad areas being defined between grooves, such that at least two grooves extend between two adjacent pad areas;

forming, on each pad area, a stacked body of semiconductor chips having spaces therebetween;

injecting, into the spaces between adjacent semiconductor chips, a resin material and allowing excess resin material to flow into, and be captured in, at least a portion of the groove defining the pad area;

singulating the pad areas of the semiconductor substrates and the stacked bodies thereon by cutting through the semiconductor substrate and at least a portion of the resin material extending between the stacked body and an adjacent groove;

providing a wiring substrate having a plurality of terminal portions on a first face and on a second face thereof;

positioning a stacked body on at least two of the terminal portions on the first face of the wiring substrate;

locating a sealing resin intermediate of the stacked bodies; and cutting through the wiring substrate and the sealing resin to form a semiconductor device.

11. The method of claim 10, further comprising:
positioning a stacked body on at least two of the terminal portions on the first face of the wiring substrate before singulating the pad areas of the semiconductor substrates and the stacked bodies thereon by cutting through the semiconductor substrate and at least a portion of the resin material extending between the stacked body and an adjacent groove.

12. The method of claim 10, further comprising:
positioning a controller chip intermediate of the stacked body and the semiconductor substrate.

13. The method of claim 12, further comprising:
positioning the stacked body to be spaced from the wiring substrate such that the controller chip is spaced from the wiring substrate.

14. The method of claim 13, further comprising introducing an underfill resin between the stacked body and wiring substrate.

* * * * *